(12) United States Patent
Wakaki

(10) Patent No.: US 9,306,127 B2
(45) Date of Patent: Apr. 5, 2016

(54) LIGHT EMITTING DEVICE THAT INCLUDES PROTECTIVE FILM HAVING UNIFORM THICKNESS

(71) Applicant: NICHIA CORPORATION, Anan-shi, Tokushima (JP)

(72) Inventor: Takayoshi Wakaki, Anan (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 14/741,329

(22) Filed: Jun. 16, 2015

(65) Prior Publication Data

US 2015/0280077 A1    Oct. 1, 2015

Related U.S. Application Data

(60) Continuation of application No. 14/172,782, filed on Feb. 4, 2014, now Pat. No. 9,087,966, which is a division of application No. 13/217,073, filed on Aug. 24, 2011, now Pat. No. 8,679,871.

(30) Foreign Application Priority Data

Aug. 25, 2010  (JP) .............................. P2010-187806
Sep. 13, 2010  (JP) .............................. P2010-203920

(51) Int. Cl.
*H01L 33/44*   (2010.01)
*H01L 33/62*   (2010.01)
*H01L 33/50*   (2010.01)
(Continued)

(52) U.S. Cl.
CPC .............. *H01L 33/44* (2013.01); *H01L 33/32* (2013.01); *H01L 33/38* (2013.01); *H01L 33/483* (2013.01); *H01L 33/502* (2013.01); *H01L 33/60* (2013.01); *H01L 33/62* (2013.01); *H01L 2224/48091* (2013.01); *H01L 2224/48247* (2013.01); *H01L 2924/09701* (2013.01)

(58) Field of Classification Search
CPC ....................................................... H01L 33/405
See application file for complete search history.

(56) References Cited

U.S. PATENT DOCUMENTS

| 6,121,635 A | 9/2000 | Watanabe et al. |
| 7,956,469 B2 | 6/2011 | Hayashi et al. |

(Continued)

FOREIGN PATENT DOCUMENTS

| CN | 1315057 A | 9/2001 |
| DE | 1020090 58 796 A1 | 6/2011 |

(Continued)

OTHER PUBLICATIONS

Extended European Search Report received in European Application No. 11178646.3 dated Jul. 7, 2014.

(Continued)

*Primary Examiner* — Stephen W Smoot
(74) *Attorney, Agent, or Firm* — Foley & Lardner LLP

(57) ABSTRACT

A light emitting device includes an electrically conductive member provided with a reflective film; a light emitting element mounted on the reflective film; and a protective film continuously covering a surface of the light emitting element and a surface of the reflective film. A thickness of the protective film on the reflective film in a vicinity of the light emitting element is substantially equal to a thickness of the protective film on the reflective film in the region except for the vicinity of the light emitting element.

21 Claims, 7 Drawing Sheets

(51) Int. Cl.
*H01L 33/60* (2010.01)
*H01L 33/32* (2010.01)
*H01L 33/38* (2010.01)
*H01L 33/48* (2010.01)

(56) References Cited

U.S. PATENT DOCUMENTS

| | | |
|---|---|---|
| 2004/0188700 A1 | 9/2004 | Fukasawa et al. |
| 2006/0092639 A1 | 5/2006 | Livesay et al. |
| 2008/0246107 A1 | 10/2008 | Maehara |
| 2009/0004386 A1 | 1/2009 | Makela et al. |
| 2009/0010017 A1 | 1/2009 | Hayashi et al. |
| 2010/0133565 A1 | 6/2010 | Cho et al. |
| 2010/0289048 A1 | 11/2010 | Kumura |
| 2011/0008550 A1 | 1/2011 | Murata et al. |
| 2011/0121326 A1 | 5/2011 | Tan et al. |
| 2012/0326178 A1 | 12/2012 | Fehrer et al. |

FOREIGN PATENT DOCUMENTS

| | | |
|---|---|---|
| JP | 62-085481 A | 4/1987 |
| JP | H03-053858 U | 5/1991 |
| JP | 2004-193280 A | 7/2004 |
| JP | 2007-109915 A | 4/2007 |
| JP | 2008-010591 A | 1/2008 |
| JP | 2008-072013 A | 3/2008 |
| JP | 2008-252004 A | 10/2008 |
| JP | 2009-033107 A | 2/2009 |
| JP | 2009-055006 A | 3/2009 |
| JP | 2009-111245 A | 5/2009 |
| JP | 2009-224538 A | 10/2009 |
| JP | 2010-007013 A | 1/2010 |
| JP | 2010-518627 A | 5/2010 |
| WO | WO-2008/097724 A2 | 8/2008 |
| WO | WO-2009/093459 A1 | 7/2009 |
| WO | WO-2010/065966 A2 | 6/2010 |

OTHER PUBLICATIONS

Hyungjun Kim et al., "Applications of atomic layer deposition to nanofabrication and emerging nanodevices", Thin Solid Films, Sep. 13, 2008, pp. 2563-2580.
Notice of Allowance issued in U.S. Appl. No. 14/172,782 mailed Mar. 17, 2015.
Office Action issued in U.S. Appl. No. 14/172,782 mailed Dec. 1, 2014.
Corrected Notice of Allowance issued in U.S. Appl. No. 14/172,782 mailed Nov. 17, 2014.
Corrected Notice of Allowance issued in U.S. Appl. No. 14/172,782 mailed Sep. 23, 2014.
Notice of Allowance issued in U.S. Appl. No. 14/172,782 mailed Aug. 20, 2014.
Office Action issued in U.S. Appl. No. 14/172,782 mailed May 13, 2014.
Office Action for Japanese Patent Application No. 2015-001027 dated Dec. 1, 2015.

LIGHT EMITTING DEVICE THAT INCLUDES PROTECTIVE FILM HAVING UNIFORM THICKNESS

CROSS-REFERENCE TO RELATED APPLICATIONS

This application is a continuation of U.S. patent application Ser. No. 14/172,782, filed Feb. 4, 2014, now U.S. Pat. No. 9,087,966 which is a divisional of U.S. patent application Ser. No. 13/217,073, filed Aug. 24, 2011, now U.S. Pat. No. 8,679,871, which claims priority to Japanese Patent Application No. 2010-187806, filed Aug. 25, 2010 and Japanese Patent Application No. 2010-203920, filed Sep. 13, 2010, the disclosures of which are hereby incorporated by reference in their entirety.

BACKGROUND OF THE INVENTION

1. Field of the Invention

The present invention relates to a method of manufacturing a light emitting device having a light emitting element disposed on an electrically conductive member.

2. Description of Related Art

Attempts have been made in a light emitting device using a light emitting element as a light source to improve optical output power by disposing a reflective film containing silver and the like around the light emitting element, and further to suppress discoloration or the like of a reflective film by forming a protective film made of an inorganic material by way of sputtering, CVD or the like (see for example, Patent reference 1: JP 2009-224538A).

Patent reference 1: JP 2009-224538A

However, when a conventional method is used, there has been a problem that although the optical output power can be improved by the reflective film, decrease in optical output power occurs during the operation. That is, in the case of sputtering, CVD, or the like, a material constituent travels more or less in a straight line toward the object and is deposited thereon to form a protective film. Therefore, for example, in the vicinity of a light emitting element, the light emitting element itself becomes an obstacle and thus a protective film of good quality has been unable to be obtained. As a result, deterioration of the reflective film starts to take place from such a portion and which causes discoloration of the reflective film.

SUMMARY OF THE INVENTION

Accordingly, an object of the present invention is to provide a light emitting device capable of maintaining high optical output power while suppressing discoloration of the reflective film and a method of manufacturing thereof.

A method of manufacturing a light emitting device according to an aspect of the present invention includes, in an order of, an electrically conductive member preparation step of preparing an electrically conductive member provided with a reflective film, a light emitting element disposing step of disposing a light emitting element on the reflective film, and a protective film forming step of forming a protective film on the reflective film by using an atomic layer deposition method.

A method of manufacturing a light emitting device according to another aspect of the present invention includes, in an order of, an electrically conductive member preparation step of preparing an electrically conductive member, a light emitting element disposing step of disposing a light emitting element on the reflective film, a wiring step of electrically connecting the electrically conductive member and the light emitting element by using a wire, a reflective film forming step of forming a reflective film on each surface of the electrically conductive member and wire, and a protective film forming step of forming a protective film on the reflective film by using an atomic layer deposition method.

A light emitting device according to an aspect of the present invention includes, an electrically conductive member provided with a reflective film; a light emitting element mounted on the reflective film; and a protective film continuously covering a surface of the light emitting element and a surface of the reflective film, wherein a thickness of the protective film on the reflective film in a vicinity of the light emitting element is substantially equal to a thickness of the protective film on the reflective film in the region except for the vicinity of the light emitting element.

According to the present invention, a light emitting device capable of maintaining high optical output power while suppressing discoloration of the reflective film and a method of manufacturing thereof may be obtained.

DETAILED DESCRIPTION OF PREFERRED EMBODIMENTS

Preferred embodiments of the present invention will be described below with reference to the accompanying drawings. The preferred embodiments are intended as illustrative of a method of manufacturing a light emitting device to give a concrete form to technical ideas of the present invention, and the scope of the invention is not limited to those described below. Particularly, the sizes, materials, shapes and the relative positions of the members described in examples are given as an example and not as a limitation to the scope of the invention unless specifically stated. The sizes and the positional relationships of the members in each of the drawings are occasionally shown exaggerated for ease of explanation.

First Embodiment

FIGS. 1A through 1F show each step of a method of manufacturing a light emitting device according to the present embodiment.

Figure 1A:
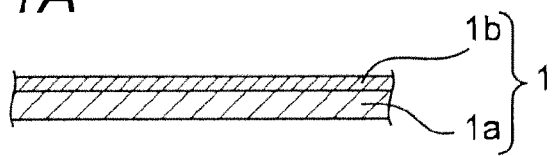
FIGS. 1A trough 1F are schematic diagrams for illustrating a method of manufacturing a light emitting device according to an embodiment of the present invention.
Figure 1B:
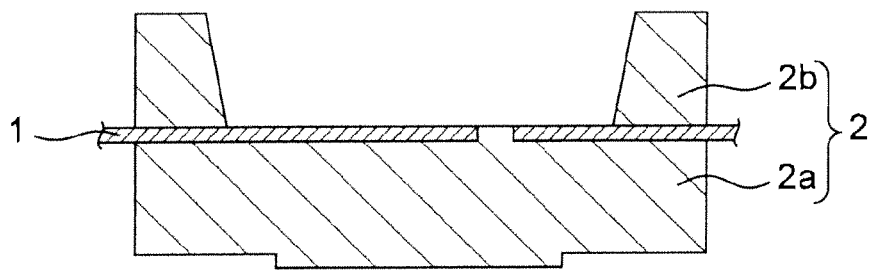
Figure 1C:
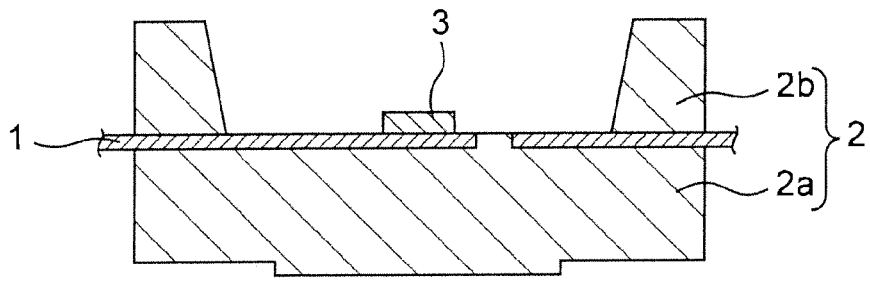
Figure 1D:
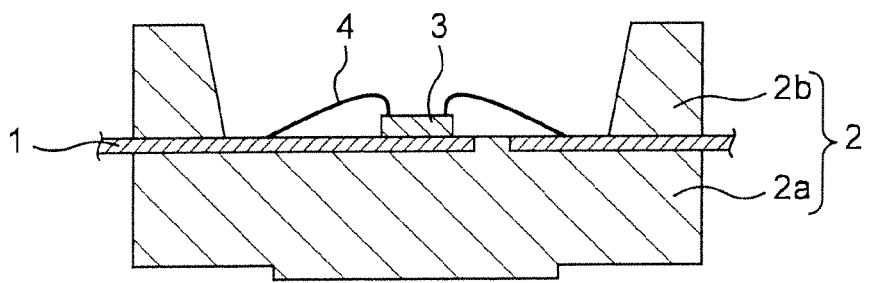
Figure 1E:
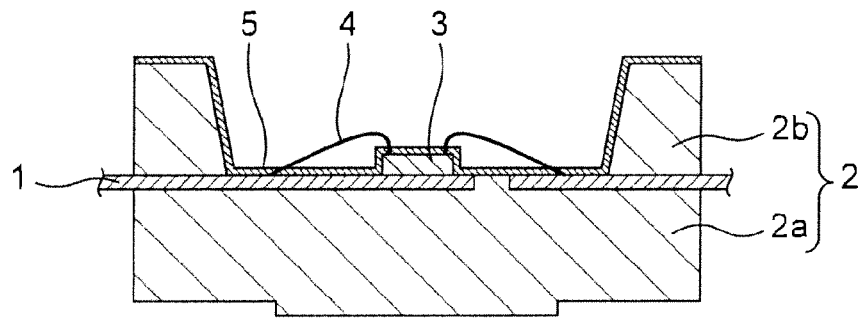
Figure 1F:
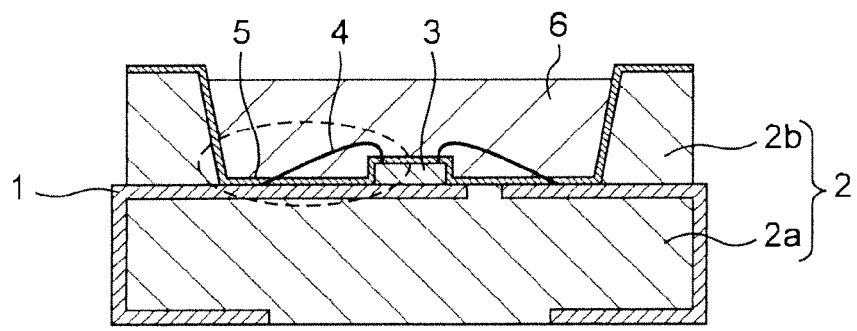
Figure 2:
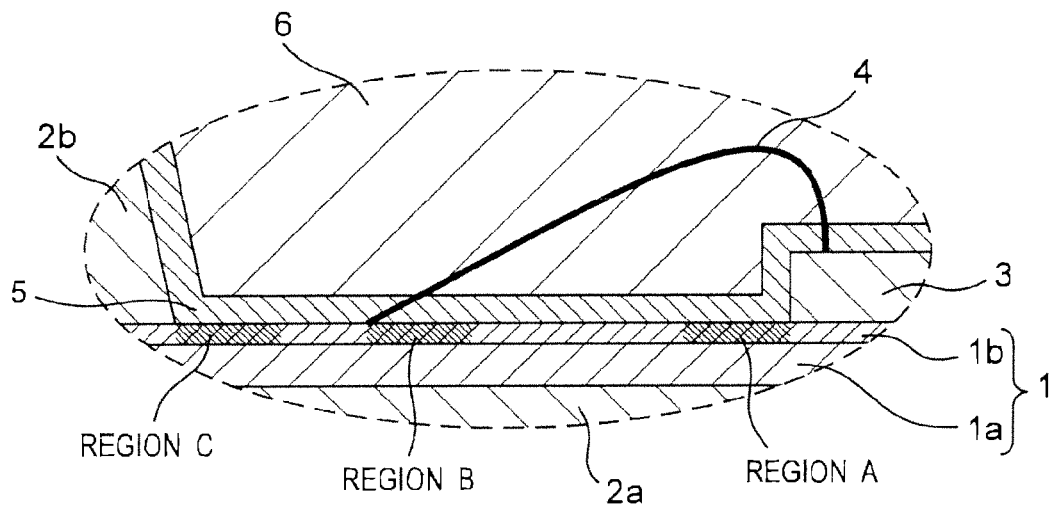
FIG. 2 is a magnified schematic view of the portion encircled with dashed line in FIG. 1F.

FIG. 2 is a magnified schematic view of the portion encircled with dashed line in FIG. 1F.

(Electrically Conductive Member Preparation Step)

First, as shown in FIG. 1A, an electrically conductive member 1 having a reflective film 1b provided on a base member 1a is prepared (electrically conductive member preparation step). In this embodiment, not only the base member 1a but also the reflective film 1b also has an electric conductivity. In the present embodiment, the electrically conductive member is constituted with a base member and a reflective film.

The material of the base member 1a is not specifically limited as long as it has electric conductivity. For the base member 1a, for example, copper or a copper alloy can be used.

The material of the reflective film 1b is not specifically limited as long as it is capable of reflecting light from the light emitting element 3. For the reflective film 1b, for example, silver, aluminum or the like can be used, and particularly, a material containing silver, which has high reflectance is preferably used.

In FIGS. 1B to 1F, the base member 1a and the reflective film 1b are not separately illustrated but are collectively illustrated as the electrically conductive member 1, for the simplicity of explanation. The electrically conductive member may be made solely of a reflective film, or may have another member interposing between the base member 1a and the reflective film 1b. Further, the reflective film 1b is not needed to be disposed on the entire upper surface of the base member 1a, as long as the reflective film 1b is disposed in the region in the vicinity of the light emitting element 3 (region A in FIG. 2).

(Package Forming Step)

Next, as shown in FIG. 1B, for example, a package 2 having a base portion 2a and a side wall 2b respectively provided on an electrically conductive member 1 may be formed (package forming step).

The material of the package is not specifically limited and, for example, a resin or a ceramic may be used. In the case where the package is made of a resin, an electrically conductive member 1 is arranged in a mold for package (not shown) and a resin for the package is introduced into the mold and is harden, thus, the package 2 and the electrically conductive member 1 can be integrally formed. A part of the electrically conductive member 1 is exposed on the bottom surface of a recess defined in the package.

The package 2 is formed integrally with the electrically conductive member 1, and the material thereof is not specifically limited as long as the material is electrically insulating. As a material of the package 2, an electrically insulating material having excellent light resistance and heat resistance is suitably used, and for example, a thermoplastic resin such as a polyphthalamide, a thermosetting resin such as an epoxy resin, and a glass epoxy and a ceramics can be used. In the present embodiment, a structure of the package 2 having a side wall 2b is employed, but the side wall is not necessarily to be provided.

(Light Emitting Element Disposing Step)

Next, as shown in FIG. 1C, a light emitting element 3 is disposed on the reflective film 1b (light emitting element disposing step). More specifically, the light emitting element 3 can be disposed on the reflective film 1b with interposing an adhesive member (not shown) therebetween. The adhesive member may either be electrically conductive or electrically insulating.

The adhesive member is for arranging and fixing the light emitting element 3 on the electrically conductive member 1 and the material thereof is not specifically limited. For example, in the case where an electrically insulating adhesive member is to be used, an epoxy resin or a silicone resin can be employed and in the case where an electrically conductive adhesive member to be used, an Au—Sn alloy, a SnAgCu alloy, a SnPb alloy, an InSn alloy, Ag, Sn, or Ag can be employed.

For the light emitting element 3, a known light emitting element can be used and, for example, an LED made of a nitride semiconductor ($In_X Al_Y Ga_{1-X-Y} N$, $0 \leq X$, $0 \leq Y$, $X+Y \leq 1$) capable of emitting blue light or green light can be used.

(Wiring Step)

Next, as shown in FIG. 1D, the light emitting element 3 and the reflective film 1b can be electrically connected by using an electrically conductive wire 4 (wiring step). In this arrangement, the light emitting element 3 and the base member 1a are electrically connected through the electrically conductive reflective film 1b.

In the case where the light emitting element 3 has a pair of electrodes (not shown) on the same surface side, and the light emitting element 3 is disposed with the side which has the electrodes facing upward (emission observing surface side), a wire 4 is needed to connect with each electrode as shown in the figure. In this case, if the electrically conductive member side of the light emitting element 3 has electrically insulating property, the adhesive member does not need to be electrically insulating and an electrically conductive member such as a metal can be used in view of thermal conductivity. In the case where an electrode is provided on each of the opposite surfaces with respect to the light emitting element, electric current is supplied to one of the electrodes through an electrically conductive adhesive member, so that only one wire is needed. On the other hand, in the case where the light emitting element has a pair of electrodes on the same surface side and is disposed with that side down (opposite side from the emission observing surface (the opposite side from the electrically conductive member 1)), the electric current can be supplied to each of the electrode through the respective electrically conductive adhesive members, so that a wire is not needed.

The wire 4 is used for electrically connecting the light emitting element 3 with the base member 1a, and the material thereof is not specifically limited. For the material of the wire 4, for example, a material containing at least one of gold, copper, platinum, aluminum, and silver can be used.

(Protective Film Forming Step)

Next, as shown in FIG. 1E, using an atomic layer deposition method (hereinafter may be referred to as "ALD" (Atomic Layer Deposition), a protective film 5 is deposited and formed on the reflective film 1b. That is, the protective film 5 is deposited from the emission observing surface side. Different from a conventional method such as sputtering, ALD is a method for depositing a layer of reaction constituent as a single-atom layer at each time. The following describes a case where a protective film of aluminum oxide ($Al_2O_3$) is deposited and formed using TMA (trimethyl aluminum) and water ($H_2O$).

First, TMA gas is introduced to react with the hydroxyl group on the surface of the reflective film which is the object (first reaction). Next, the excess gas is purged. Thereafter, $H_2O$ gas is introduced to react with the TMA which is bonded to the hydroxyl group in the first reaction (second reaction). Next, the excess gas is purged. Then, setting the first reaction, purging, the second reaction, and purging as one cycle, the cycle is repeated to obtain $Al_2O_3$ with a predetermined thickness.

Unlike that in the case of sputtering, CVD, or the like, a reaction constituent travels in a less straight line in ALD. Therefore, the reaction component can be supplied even to a portion in the vicinity of an obstacle, so that a single molecular layer of the reaction component can be deposited at each time, even to a portion in the vicinity of an obstacle. As a result, a protective film of higher quality can be deposited with more uniform thickness and film quality even to a region in the vicinity of an obstacle, as well as to other regions free of obstacles.

Protective film obtained by using ALD has higher quality and higher protective property compared to that of the protective films obtained by using a conventional method. Thus, partial discoloration occurs with a certain proportion even in a region free from an obstacle in a protective film obtained by using a conventional method, however, a protective film obtained by using ALD exhibits substantially no discoloration regardless of the presence of an obstacle. Further, even with a small thickness, the protective film obtained by using ADL is capable of sufficiently protecting the reflective film. Thus, the protective film can be provided with a smaller thickness than that of the protective films obtained by using a conventional method. With this arrangement, the absorption of light by the protective film can be suppressed and a light emitting device having high optical output power in its initial properties can be obtained.

In the case where the protective film 5 is formed after disposing the light emitting element 3, when a conventional method is used, there has been a problem that the light emitting element 3 itself acts as an obstacle, preventing the material constituent of the protective film 5 from sufficiently reaching the portions at or near the periphery of the light emitting element 3. The resulting reduction in quality and/or insufficient thickness of the protective film 5 has caused deterioration and discoloration of the reflective film in a region in the vicinity of the light emitting element 3 (region A in FIG. 2). This is considered that a larger number of pin holes compared with that in the other portions occur in the deteriorated portions of the protective film, causing sulfurization or bromination of the reflective film which leads occurrence of discoloration. The portions in the vicinity of the light emitting element can produce high optical output power, so that if discoloration of the reflective film in the vicinity of the light emitting element occurs, the optical output power of the light emitting device will be significantly decreased.

Accordingly, with employing ADL, the protective film 5 with excellent film quality and the like can be obtained even in the region (region A in FIG. 2) in the vicinity of the light emitting element. As a result, occurrence of discoloration or the like in the reflective film 1b of the region A can be suppressed. Further, with employing ADL, a thickness of the protective film 5 on the reflective film 1b in the vicinity of the light emitting element is substantially equal to a thickness of the protective film 5 on the reflective film 1b in the region except for the vicinity of the light emitting element in addition to forming the protective film 5 with excellent film quality. Therefore, according to the method of the present invention, the protective film 5 with excellent film quality can be formed with a thickness required to prevent discoloration of the reflective film 1b even in the vicinity of the light emitting element that would be an obstacle when forming the protective film 5, which makes it possible to effectively prevent deterioration of the reflective film 1b.

Particularly, in the case where the adhesive member presents within the circumference of the light emitting element and without reaching a side surface of the light emitting element when seen in a cross-sectional view, a gap may be created between the circumference of the bottom surface of the light emitting element and the reflective film. Even in such a case, with using ALD, the protective film can be formed also on the reflective film in the gap.

In the case where the protective film is to be formed using a conventional method after the wiring step, there has been a problem that the existence of wire 4 (the wire 4 acts as an obstacle) prevents the material constituent of the protective film 5 from sufficiently reaching the reflective film 1b beneath the wire 4. The resulting reduction in quality and/or insufficient thickness of the protective film 5 has caused discoloration of the reflective film 1b in the portion. Particularly, among the regions beneath the wire 4, there has been a problem in the region in the vicinity of the connecting portion of the wire 4 and the reflective film 1b (region B in FIG. 2) that when a conventional method is used, not only discoloration of the reflective film 1a but also corrosion of the reflective film 1b takes place and results in breaking of the wire 4.

However, with a use of ADL, the protective film 5 with excellent film quality and the like can be formed even in the region (region B in FIG. 2) directly under the wire 4. Accordingly, deterioration of the protective film in the region B can be reduced and not only discoloration but also braking of the wire can be suppressed.

In addition, according to the method of manufacturing in which the protective film 5 is formed by means of ALD, the protective film 5 is formed so as to fill a gap formed between an edge portion of the wire 4 connected to the reflective film 1b and the reflective film 1b, thereby preventing discoloration and corrosion of the reflective film 1b positioned around the gap.

In addition, according to the present invention, in spite of a form of the wire 4, for example, a shape of the edge portion of the wire 4 and a direction of the wire 4 extending from the edge portion etc., the protective film 5 is formed on the reflective film 1b around the edge portion of the wire 4 with a substantially equal thickness.

Further, according to the present invention, a thickness of the protective film 5 on the reflective film 1b in the vicinity of the edge portion of the wire 4 is substantially equal to a thickness of the protective film 5 on the reflective film 1b in the region except for the vicinity of the edge portion of the wire 4. Therefore, discoloration and corrosion of the reflective film 1b around the edge portion of the wire 4 can be effectively prevented.

Figure 4A:
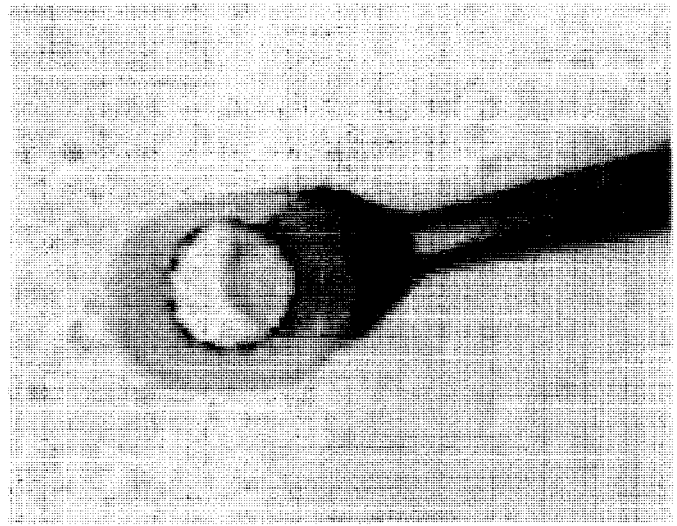
FIG. 4A is a photograph around the connecting portion of the wire and the reflective film covered with the protective film deposited by using ALD.
Figure 4B:
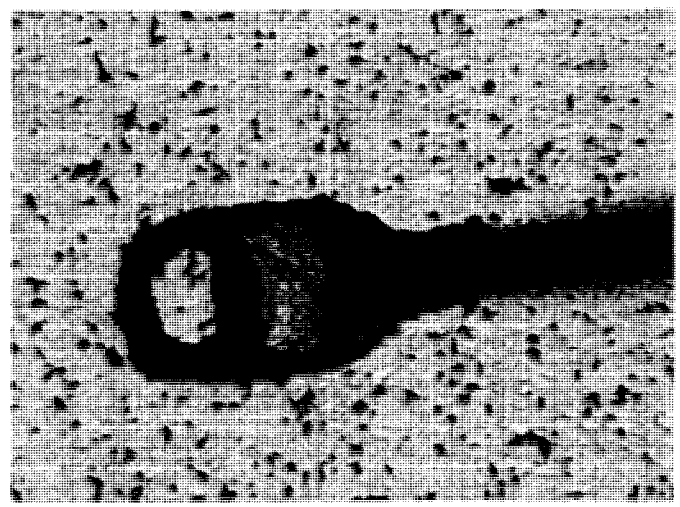
FIG. 4B is a photograph around the connecting portion of the wire and the reflective film covered with the protective film deposited by using a conventional sputtering method.
Figure 5A:
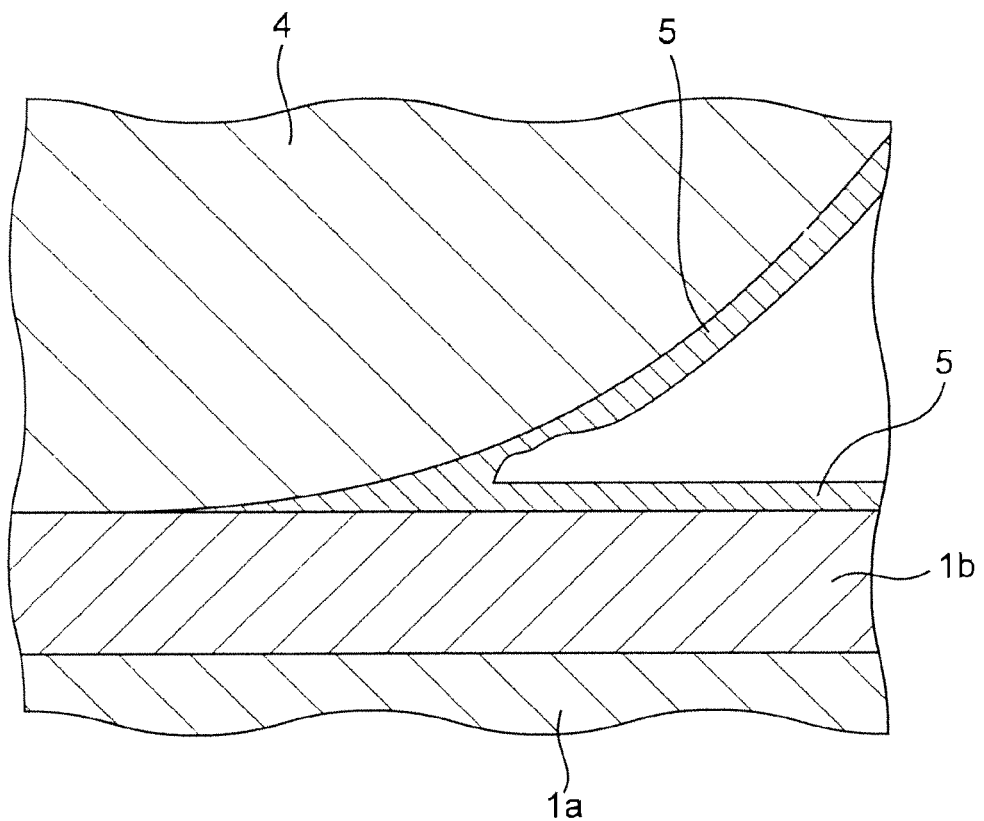
FIG. 5A is a magnified section view of an edge portion of the wire connected to the reflective film in an embodiment of the present invention.
Figure 5B:
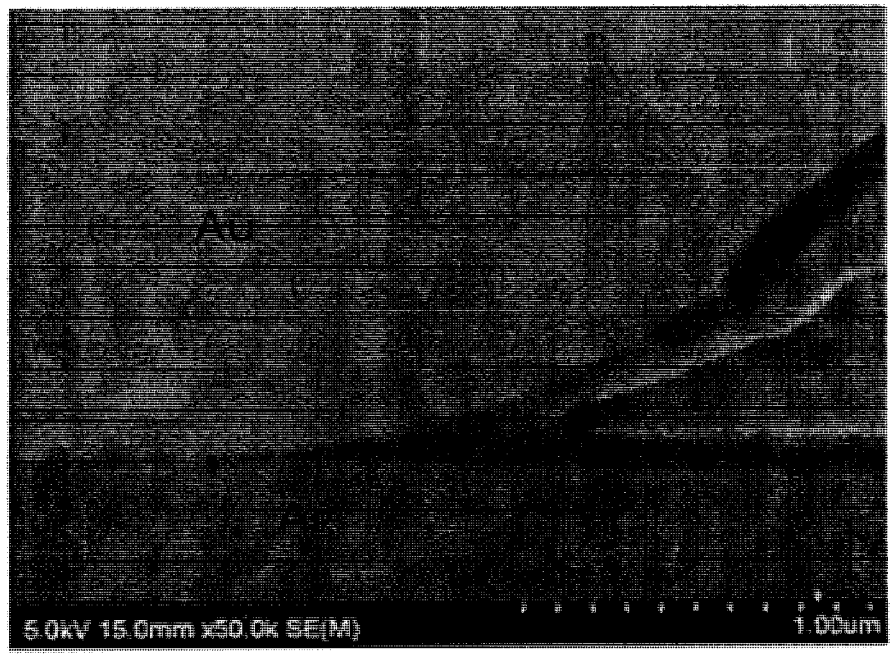
FIG. 5B is a photograph corresponding to FIG. 5A.

FIGS. 4A and 4B each shows the image around the connecting portion of the wire and the reflective film, taken from the emission observing surface side after the protective film depositing step. FIG. 4A shows a protective film made of $Al_2O_3$ with a thickness of 30 nm, deposited by using ALD, and FIG. 4B shows a protective film made of $Al_2O_3$ with a thickness of 30 nm, deposited by using a conventional sputtering method. These images were taken after the reflective films made of Ag were left in a condition of excess sulfide for a given period time to facilitate sulfurization of the films (both were tested under the same condition). As shown in FIG. 4A, even exposed under an easily-sulfurized condition, the protective film formed by using ALD showed no discoloration not only in the regions away from the wire and free of obstacles but also in the region (corresponding to region B in FIG. 2) directly under the wire. On the other hand, as shown in FIG. 4B, the protective film deposited by sputtering showed dot shaped discoloration at a number of positions even in the regions away from the wire and free of obstacles, and showed continuous discoloration in the regions around the connecting portion of the wire and the reflective film, including the region directly under the wire (this is considered that microscopic unevenness exists in the connecting portion of the wire and the reflective film and acts as an obstacle, so that discoloration occurred not only in the region directly under the wire but also in the entire region around the connecting portion). The results of the experiments described above exhibit that forming the protective film with a use of ALD enables to obtain a protective film of excellent quality.

In order to improve the optical output power of the light emitting device, for example, a wire made of a material containing silver which has high reflectance can be employed to obtain efficient light reflection from the wire. However, as in the case of discoloration of reflective film, discoloration of the wire which is made of a silver-containing material may also present a problem. Even in such a case, with a use of ALD, the protective film can be formed on the entire surface of the wire including the emission observing surface side of the wire to the opposite side (reflective film side) of the wire, with the reason as described above. Thus, discoloration or the like of the wire can be suppressed efficiently.

In the case where the protective film is formed with a use of a conventional method after the package forming step, there has been a problem that due to the existence of the side wall of the package 2 (the side wall of the package acts as an obstacle), the material constituent of the protective film 5 cannot sufficiently reach a portion of the bottom surface defining the recess in the vicinity of the side wall (region C in FIG. 2). The resulting reduction in quality and/or insufficient thickness of the protective film 5 caused discoloration of corresponding part of the reflective film 1b. Discoloration of the protective film 1b in the vicinity of the side wall of the package 2 may not pose harmful effect on the optical output power as that of the discoloration of the reflective film 1b in the region A, but the problem can never be ignored.

Accordingly, with employing ADL, the protective film 5 which is excellent in film quality and the like can be obtained even in the region (region C in FIG. 2) in the vicinity of the side wall 2b. With this arrangement, occurrence of discoloration of the protective film 1b in the region C can be suppressed and decrease in the optical output power of the light emitting device can be further reduced.

In the case where the protective film 1b contains silver, there has been a problem that although having high reflectance is an advantageous property, with a use of a conventional method, the optical output power tends to decrease due to discoloration of the reflective film 1b in the course of time. However, the protective film formed by using ALD is capable of efficiently suppressing occurrence of discoloration or the like, even in a case where the protective film is made of a silver-containing material, and thus is preferable.

For the protective film 5, for example, aluminum oxide ($Al_2O_3$), silicon dioxide ($SiO_2$), aluminum nitride (AlN), or silicon nitride ($Si_3N_4$) can be employed, and preferably, aluminum oxide or silicone dioxide, more preferably aluminum oxide can be used. With this arrangement, absorption of light from the light emitting element can be suppressed and a protective film of excellent protection property can be obtained.

The thickness of the protective film 5 can be 1 nm or greater and less than 50 nm, preferably 2 nm or greater and less than 25 nm, more preferably 3 nm or greater and less than 10 nm. With this arrangement, while maintaining the functions as a protective film, absorption of light from the light emitting element by the protective film can be suppressed, so that the light emitting element of high optical output power can be obtained.

As shown in the figures such as FIG. 1E, the protective film 5 is formed not only on the bottom surface defining the recess of the package 2 but also on the upper surface and inner wall of the side wall 2b, but for example, the upper surface and inner wall of the side wall 2b can be arranged so that the protective film 5 is not formed thereon. A region which is free of the protective film 5 can be provided in a part of the bottom surface defining the recess of the package 2.

(Other Steps)

As shown in FIG. 1F, if required, a sealing member 6 can be formed in the recess defined by the side wall 2b of the package (sealing member forming step). Then, after cutting the electrically conductive member 1 so as to obtain each light emitting device capable of functioning individually (electrically conductive member cutting step), if required, each electrically conductive member 1 is bent to the back side of the corresponding package 2 (electrically conductive member bending step), to form individual light emitting devices.

The sealing member 6 is to enclose the light emitting element 3, and the material thereof is not specifically limited as long as it allows the light from the light emitting element 3 to pass through to the outside. For the material of the sealing member 6, for example, a silicone resin, an epoxy resin, or the like can be used. Further, a fluorescent substance capable of emitting light upon receiving the light from the light emitting element 3 can be included also in the sealing member 6. For the fluorescent substance, a known substance can be used, and in the case where the light emitting element 3 emits blue light, a yellow light emitting fluorescent substance such as a YAG-based fluorescent substance, a TAG-based fluorescent substance, and a strontium silicate-based fluorescent substance can be used to obtain white light emission from the light emitting device.

Second Embodiment

The present embodiment will be described below with reference to FIGS. 3A to 3G. In this embodiment, like members as in the first embodiment are designated by like numerals and their repeated description will be omitted.

(Electrically Conductive Member Preparation Step)

Figure 3A:
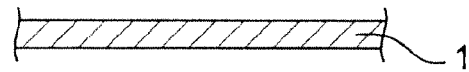
FIGS. 3A trough 3G are schematic diagrams for illustrating a method of manufacturing a light emitting device according to another embodiment of the present invention.

First, as shown in FIG. 3A, the electrically conductive member 1 is prepared (electrically conductive member preparation step). In the present embodiment, different from that in the first embodiment, the electrically conductive member is made of the base member alone, and the reflective film 1b is not provided in this step.

(Package Forming Step)

Figure 3B:
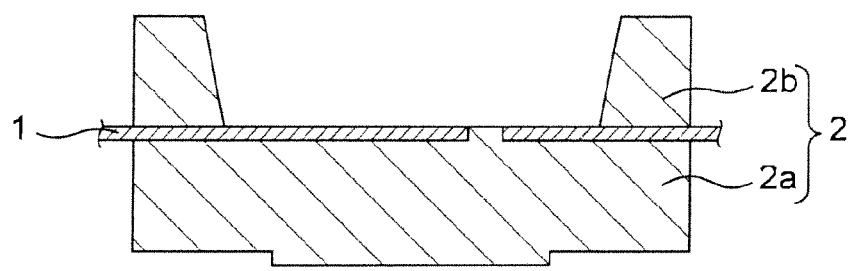

Next, as shown in FIG. 3B, a package 2 having a base portion 2a and a side wall 2b provided on an electrically conductive member 1 can be formed (Package Forming Step).

(Light Emitting Element Disposing Step)

Figure 3C:
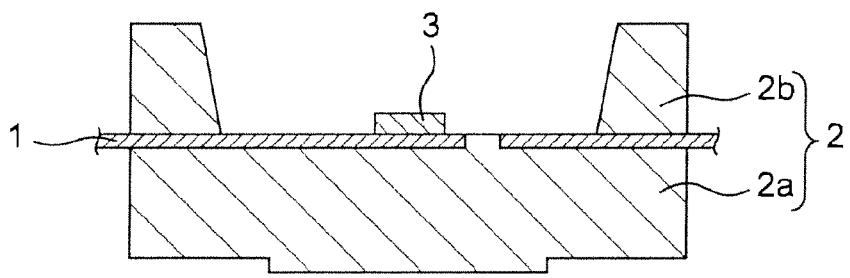

Next, as shown in FIG. 3C, a light emitting element 3 is disposed on the electrically conductive member 1 (light emitting element disposing step). More specifically, the light emitting element 3 can be disposed on the electrically conductive member 1 using an adhesive member (not shown).

(Wiring Step)

Figure 3D:
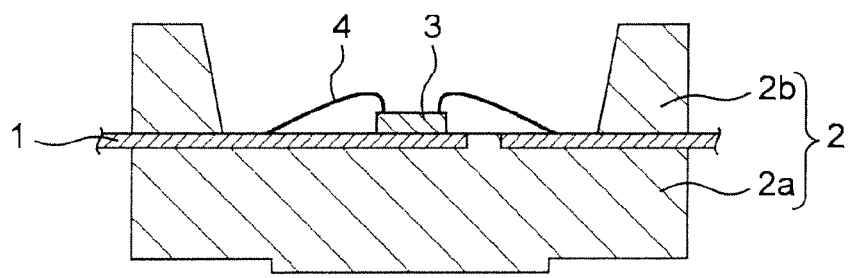
Figure 3E:
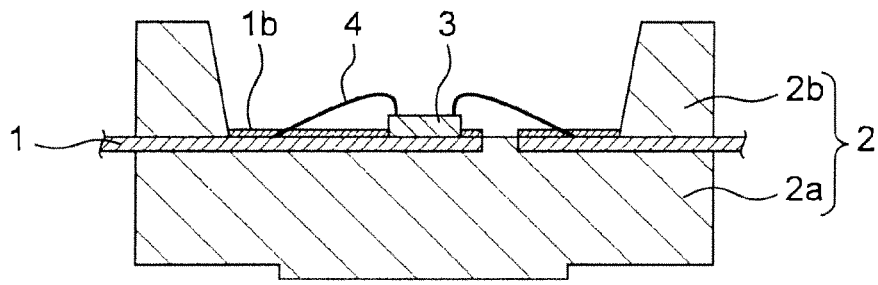

Next, as shown in FIG. 3D, the electrically conductive member 1 and the light emitting element 3 are electrically connected by using an electrically conductive wire 4 (wiring step).

(Reflective Film Forming Step)

Next, the reflective film 1b is formed on the surface of the electrically conductive member 1 and the wire 4 (reflective film forming step). For the sake of drawing the figure, the reflective film 1b on the surface of each wire 4 is not shown in FIG. 3E, but according to the present embodiment, the reflective film 1b is actually formed not only on the surface of each electrically conductive member 1 but also on the surface of each wire 4. The reflective film 1b also covers the connecting portion of the electrically conductive member 1 and the wire 4.

With this arrangement, absorption of light by the surface of the wires 4 can be suppressed and a light emitting device of further higher optical output power can be obtained.

For the method of forming the reflective film 1*b*, a known method can be employed. Particularly, with a use of an electroplating method, the reflective film 1*b* can be formed selectively on the surfaces of the electrically conductive member 1, the wire 4, or the like, without forming the reflective film (metal film) on the surface of the light emitting element 3 which is not electrically conductive. For the material of the reflective film 1*b*, the same materials as in the first embodiment can be used, and silver or the like can be employed.

(Protective Film Depositing Step)

Figure 3F:
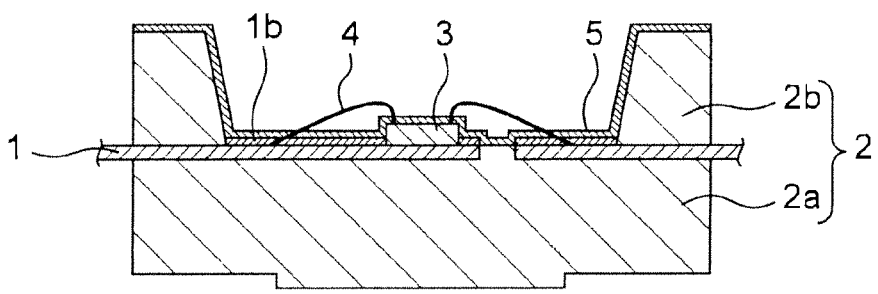

Next, as shown in FIG. 3F, the protective film 5 is formed on the surface of the reflective film 1*b* by using ALD. For the sake of drawing the figure, the protective film 5 on the surface of each wire 4 is not shown in FIG. 3F, but in the present embodiment, actually, the protective film 5 is formed also on the surface of each wire 4 over the reflective film 1*b*.

(Other Steps)

Figure 3G:
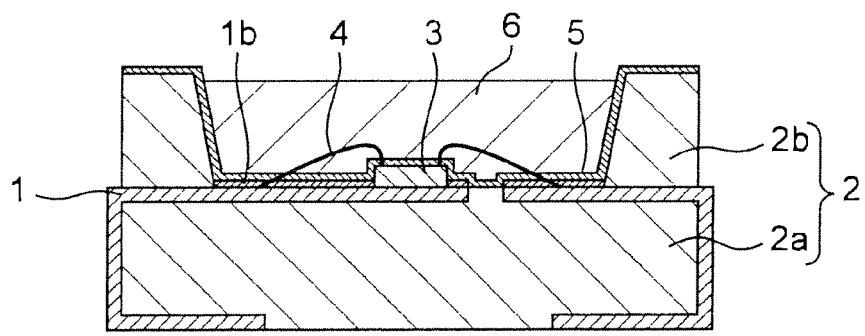

As shown in FIG. 3G, if required, a sealing member 6 can be formed in the recess defined by the side wall 2*b* of the package (sealing member forming step). Then, after cutting the electrically conductive member 1 so as to obtain each light emitting device capable of functioning individually (electrically conductive member cutting step), if required, each electrically conductive member 1 is bent to the back side of the corresponding package 2 (electrically conductive member bending step), to form individual light emitting devices.

INDUSTRIAL APPLICABILITY

The method of manufacturing the light emitting device according to the present invention can be applied to manufacturing various kinds of light emitting devices such as illumination light sources, light sources for various kinds of indicators, light sources for automobile use, light sources for displays, back light sources for liquid crystal displays, light sources for sensors, signals, and so on.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

This application is based on applications No. 2010-187806 filed in Japan on Aug. 25, 2010, and No. 2010-203920 filed in Japan on Sep. 13, 2010, the contents of which are incorporated hereinto by references.

The invention claimed is:

1. A light-emitting device comprising:
   a substrate that includes a pair of electrically conductive members and a base portion;
   a light emitting element mounted on the substrate, wherein a gap is located between a portion of the substrate and a portion of the light emitting element,
   a protective film having a portion that covers a surface of the light emitting element, and a portion that is disposed on the substrate in the gap between said portion of the substrate and said portion of the light emitting element, and
   wherein a thickness of the protective film in said portion that covers the surface of the light emitting element is substantially equal to a thickness of the protective film in said portion that is disposed on the substrate in the gap between said portion of the substrate and said portion of the light emitting element.

2. The light-emitting device of claim 1, wherein the light emitting element includes a pair of electrodes that are both located on a substrate side of the light emitting element.

3. The light-emitting device of claim 1, wherein the light emitting element is mounted on the substrate via a plurality of adhesive members.

4. The light-emitting device of claim 3, wherein the adhesive members are electrically conductive.

5. The light-emitting device of claim 4, wherein each of the adhesive members comprises one or more of an Au—Sn alloy, a SnAgCu alloy, a SnPb alloy, an InSn alloy, Ag, Sn, and Ag.

6. The light-emitting device of claim 4, wherein the light emitting element comprises a nitride semiconductor.

7. The light-emitting device of claim 4, wherein the protective film comprises aluminum oxide.

8. The light-emitting device of claim 4, wherein the protective film comprises silicon dioxide.

9. The light-emitting device of claim 4, wherein the substrate comprises a base portion comprising a ceramic material.

10. The light-emitting device of claim 4, further comprising a side wall disposed above the electrically conductive members.

11. The light-emitting device of claim 4, wherein the protective film is a film deposited via atomic layer deposition.

12. The light-emitting device of claim 4, wherein a thickness of the protective film is 1 nm or greater and less than 50 nm.

13. The light-emitting device of claim 4, wherein a thickness of the protective film is 2 nm or greater and less than 25 nm.

14. The light-emitting device of claim 4, wherein a thickness of the protective film is 3 nm or greater and less than 10 nm.

15. The light-emitting device of claim 1, wherein the light emitting element comprises a nitride semiconductor.

16. The light-emitting device of claim 1, wherein the protective film comprises aluminum oxide.

17. The light-emitting device of claim 1, wherein the protective film comprises silicon dioxide.

18. The light-emitting device of claim 1, wherein the protective film is a film deposited via atomic layer deposition.

19. The light-emitting device of claim 1, wherein a thickness of the protective film is 1 nm or greater and less than 50 nm.

20. The light-emitting device of claim 1, wherein a thickness of the protective film is 2 nm or greater and less than 25 nm.

21. The light-emitting device of claim 1, wherein a thickness of the protective film is 3 nm or greater and less than 10 nm.

* * * * *